United States Patent
Ying et al.

(10) Patent No.: US 6,841,484 B2
(45) Date of Patent: Jan. 11, 2005

(54) METHOD OF FABRICATING A MAGNETO-RESISTIVE RANDOM ACCESS MEMORY (MRAM) DEVICE

(76) Inventors: Chentsau Ying, 10370 N. Blaney Ave., Cupertino, CA (US) 95014; Xiaoyi Chen, 811 Volans La., Foster City, CA (US) 94404; Chun Yan, 6066 Elmbridge Dr., San Jose, CA (US) 95129; Ajay Kumar, 510 Kenilworth Ct., Sunnyvale, CA (US) 94087

( * ) Notice: Subject to any disclaimer, the term of this patent is extended or adjusted under 35 U.S.C. 154(b) by 0 days.

(21) Appl. No.: 10/418,449

(22) Filed: Apr. 17, 2003

(65) Prior Publication Data

US 2004/0209476 A1 Oct. 21, 2004

(51) Int. Cl.[7] .......................................... H01L 21/302
(52) U.S. Cl. ................... 438/710; 438/706; 438/709
(58) Field of Search ................ 438/611–614, 636–638, 438/718–720

(56) References Cited

U.S. PATENT DOCUMENTS

| | | | |
|---|---|---|---|
| 4,105,805 A | 8/1978 | Glendinning et al. ......... 427/38 |
| 4,874,723 A | 10/1989 | Jucha et al. | |
| 4,906,328 A | 3/1990 | Freeman et al. ............ 156/643 |
| 4,985,113 A | 1/1991 | Fujimoto et al. ........... 156/643 |
| 5,248,636 A | 9/1993 | Davis et al. | |
| 5,691,246 A | 11/1997 | Becker et al. | |
| 5,976,986 A | 11/1999 | Naeem et al. .............. 438/714 |
| 6,133,145 A | * 10/2000 | Chen .......................... 438/636 |
| 6,162,733 A | * 12/2000 | Obeng ........................ 438/706 |
| 6,374,833 B1 | * 4/2002 | Yuan et al. .................. 134/1.1 |

* cited by examiner

*Primary Examiner*—Dung A. Le
(74) *Attorney, Agent, or Firm*—Moser, Patterson & Sheridan, LLP; Joseph Bach

(57) ABSTRACT

A method of etching a multi-layer magnetic stack (e.g., layers of cobalt-iron alloy (CoFe), ruthenium (Ru), platinum-manganese alloy (PtMn), and the like) of a magneto-resistive random access memory (MRAM) device is disclosed. Each layer of the multi-layer magnetic stack is etched using a process sequence including a plasma etch step followed by a plasma treatment step. The plasma treatment step uses a plasma comprising an inert gas to remove residues formed during the plasma etch step.

15 Claims, 8 Drawing Sheets

US 6,841,484 B2

METHOD OF FABRICATING A MAGNETO-RESISTIVE RANDOM ACCESS MEMORY (MRAM) DEVICE

BACKGROUND OF THE INVENTION

1. Field of the Invention

The present invention generally relates to a method for fabricating devices on semiconductor substrates. More specifically, the invention relates to a method for fabricating a magneto-resistive random access memory (MRAM) device.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in memories such as magneto-resistive random access memories (MRAM) that facilitate storage of digital information.

A memory cell in a MRAM device is a multi-layered structure comprising two sets of magnetic layers separated by a non-magnetic dielectric material. These layers are deposited as overlying blanket films, and then patterned to form the MRAM device. More specifically, the MRAM device comprises a top electrode layer (e.g., tantalum (Ta), tantalum nitride (TaN), and the like), a free magnetic layer (e.g., NiFe, CoFe, and the like), a tunnel layer (e.g., $Al_2O_3$, and the like), a multi-layer magnetic stack comprising layers of cobalt-iron alloy (CoFe), ruthenium (Ru), platinum-manganese alloy (PtMn), and the like, a bottom electrode (e.g., Ta, TaN, and the like), and a barrier layer (e.g., $SiO_2$, and the like).

Fabrication of a MRAM device comprises plasma etch processes in which one or more layers of a MRAM film stack are removed, either partially or in total. The MRAM film stack comprises materials that are sensitive to corrosion and may be easily eroded, oxidized, or damaged during device fabrication, as well as develop difficult to remove metal-containing residues. Such residues generally build up along the sides of the MRAM film stack and may form a veil-like pattern. The conductive residues or eroded layers may cause electrical short-circuits within the MRAM film stack.

The magnetic materials of the multi-layer magnetic stack are generally etched using predominantly physical plasma processes, such as ion milling, sputtering, and the like. Such etch processes have low etch rates for magnetic materials (e.g., CoFe, Ru, PtMn, and the like) and typically produce metal-containing residues. Removal of such residues are time-consuming routines that decrease productivity and increase the cost of fabricating the MRAM devices.

Therefore, there is a need in the art for an improved method of etching magnetic materials for fabrication of a magneto-resistive random access memory (MRAM) device.

SUMMARY OF THE INVENTION

The present invention is a method of etching a multi-layer magnetic stack (e.g., layers of cobalt-iron alloy (CoFe), ruthenium (Ru), platinum-manganese alloy (PtMn), and the like) of a magneto-resistive random access memory (MRAM) device. Each layer of the multi-layer magnetic stack is etched using a process sequence including a plasma etch step followed by a plasma treatment step. The plasma treatment step uses a plasma comprising an inert gas to remove residues formed during the plasma etch step.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of etching a multi-layer magnetic stack (e.g., layers of cobalt-iron alloy (CoFe), ruthenium (Ru), platinum-manganese alloy (PtMn), and the like) of a magneto-resistive random access memory (MRAM) device. Each layer of the multi-layer magnetic stack is etched using a process sequence including a plasma etch step followed by a plasma treatment step. The plasma treatment step uses a plasma comprising an inert gas to remove residues formed during the plasma etch step.

Figure 1:
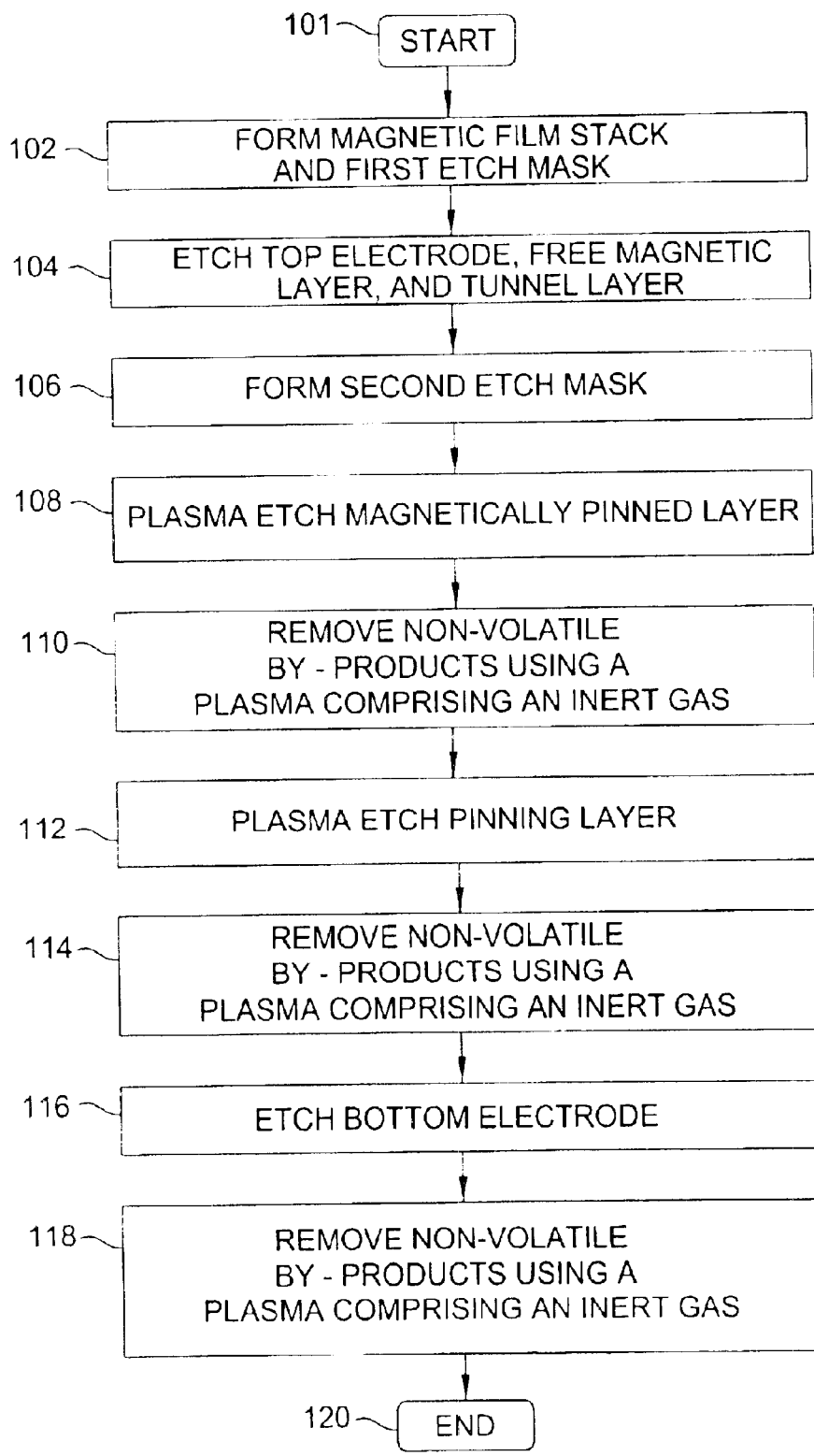
FIG. 1 depicts a flow diagram of a method of etching magnetic materials in accordance with one embodiment of the present invention.

FIG. 1 depicts a flow diagram of one embodiment of the inventive method for etching the multi-layer magnetic stack of a magneto-resistive random access memory (MRAM) device as sequence 100. The sequence 100 includes the processes that are performed upon a magneto-resistive random access memory (MRAM) film stack during fabrication of such MRAM device.

FIGS. 2A–2I depict a series of schematic, cross-sectional views of a substrate comprising a MRAM device being formed using the sequence 100. To best understand the invention, the reader should simultaneously refer to FIG. 1 and FIGS. 2A–2I. The cross-sectional views in FIGS. 2A–2I relate to the process steps that are used to form the MRAM device. Sub-processes and lithographic routines (e.g., exposure and development of photoresist, wafer cleaning procedures, and the like) are well known in the art and, as such, are not shown in FIG. 1 and FIGS. 2A–2I. The images in FIGS. 2A–2I are not depicted to scale and are simplified for illustrative purposes.

Figure 2A:
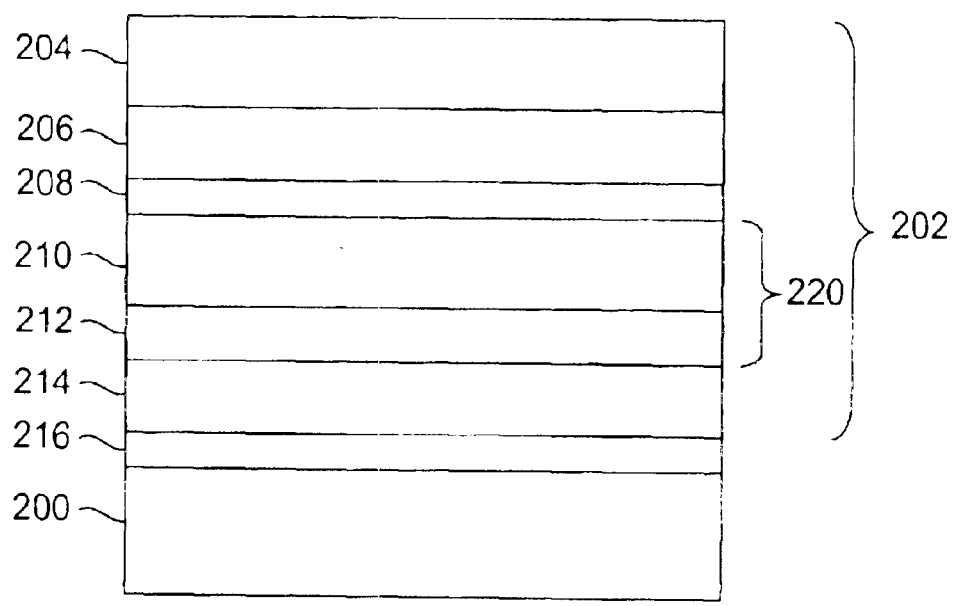
FIGS. 2A–2I depict a series of schematic, cross-sectional views of a substrate having a MRAM film stack being formed in accordance with the method of FIG. 1.

The sequence 100 starts at step 101 and proceeds to step 102, when a MRAM film stack 202 is formed on a substrate 200, such as a silicon (Si) wafer, and the like (FIG. 2A). In one embodiment, the MRAM film stack 202 comprises a top electrode layer 204, a free magnetic layer 206, a tunnel layer 208, a multi-layer magnetic stack 220, a bottom electrode layer 214, and a barrier layer 216.

The top electrode layer 204 and the bottom electrode layer 214 are generally each formed of a conductive material (e.g., tantalum (Ta), tantalum nitride (TaN), copper (Cu), and the like) to a thickness of about 200–600 Angstroms. The free magnetic layer 206 may comprise one or more films of nickel-iron (NiFe) alloy, cobalt-iron (CoFe) alloy, and the like to a thickness of about 20–200 Angstroms.

The tunnel layer 208 forms a magnetic tunnel junction of the MRAM device and is composed of a non-magnetic dielectric material, such as alumina ($Al_2O_3$), and the like. Generally, the tunnel layer 208 has a thickness of about 10–20 Angstroms.

The multi-layer magnetic stack 220 typically comprises a pinned layer 210 and a pinning layer (i.e., anti-ferromagnetic layer) 212. The pinned layer 210 may comprise at least one film of cobalt-iron (CoFe) alloy, ruthenium (Ru), nickel-iron-chromium (NiFeCr) alloy, nickel-iron (NiFe) alloy, and the like. The pinning layer 212 may comprise at least one film of platinum-manganese (PtMn) alloy, iridium-manganese (IrMn) alloy, and the like. Each of the films of the multi-layer magnetic stack 220 are generally formed to a thickness of about 8–200 Angstroms.

The barrier layer 216 is generally formed from a dielectric material (e.g., silicon dioxide ($SiO_2$), silicon nitride ($Si_3N_4$), and the like) to a thickness of about 100–500 Angstroms. It should be understood that, in other embodiments, the MRAM film stack 202 may comprise layers that are formed from different materials.

The layers of the MRAM film stack 202 can be formed using any conventional thin film deposition technique, such as atomic layer deposition (ALD), physical vapor deposition (PVD), chemical vapor deposition (CVD), plasma enhanced CVD (PECVD), and the like. Fabrication of the MRAM devices may be performed using the respective processing reactors of CENTURA®, ENDURA®, and other semiconductor water processing systems available from Applied Materials, Inc. of Santa Clara, Calif.

Figure 2B:
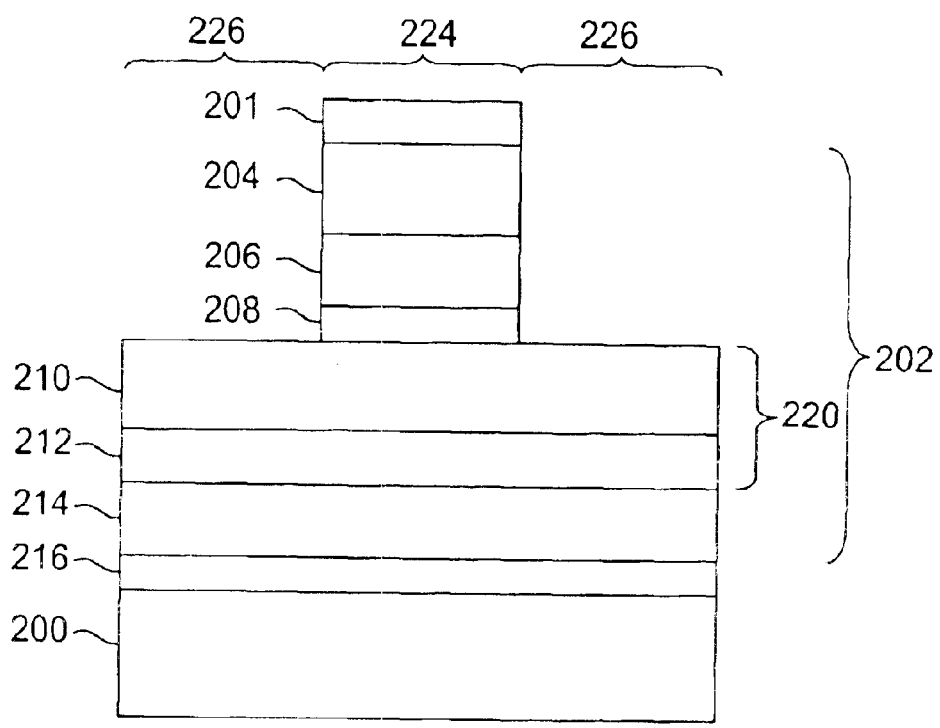

At step 104, the top electrode layer 204, the free magnetic layer 206, and the tunnel layer 208 are each, plasma etched and removed in regions 226 (FIG. 2B). In one exemplary embodiment, a first etch mask 201 is formed on the top electrode layer 204 of the MRAM film stack 202. The first etch mask 201 defines location and topographic dimensions for the MRAM devices being fabricated. In the depicted embodiment, the first etch mask 201 protects regions 224 of the MRAM film stack 202 and exposes adjacent regions 226 thereof. During step 104, the top electrode layer 204 may be etched using a chlorine-containing gas or a fluorine-containing gas. The free magnetic layer 206 and the tunnel layer 208 may be etched using a gas mixture comprising an oxygen-containing gas and a chlorine-containing gas. After the top electrode layer 204, the free magnetic layer 206 and the tunnel layer 208 are plasma etched, the first etch mask 201 may optionally be removed. Such etch processes are described, for example, in commonly assigned U.S. patent application Ser. No. 10/218,244, filed Aug. 12, 2002, which is incorporated herein by reference.

Figure 2C:
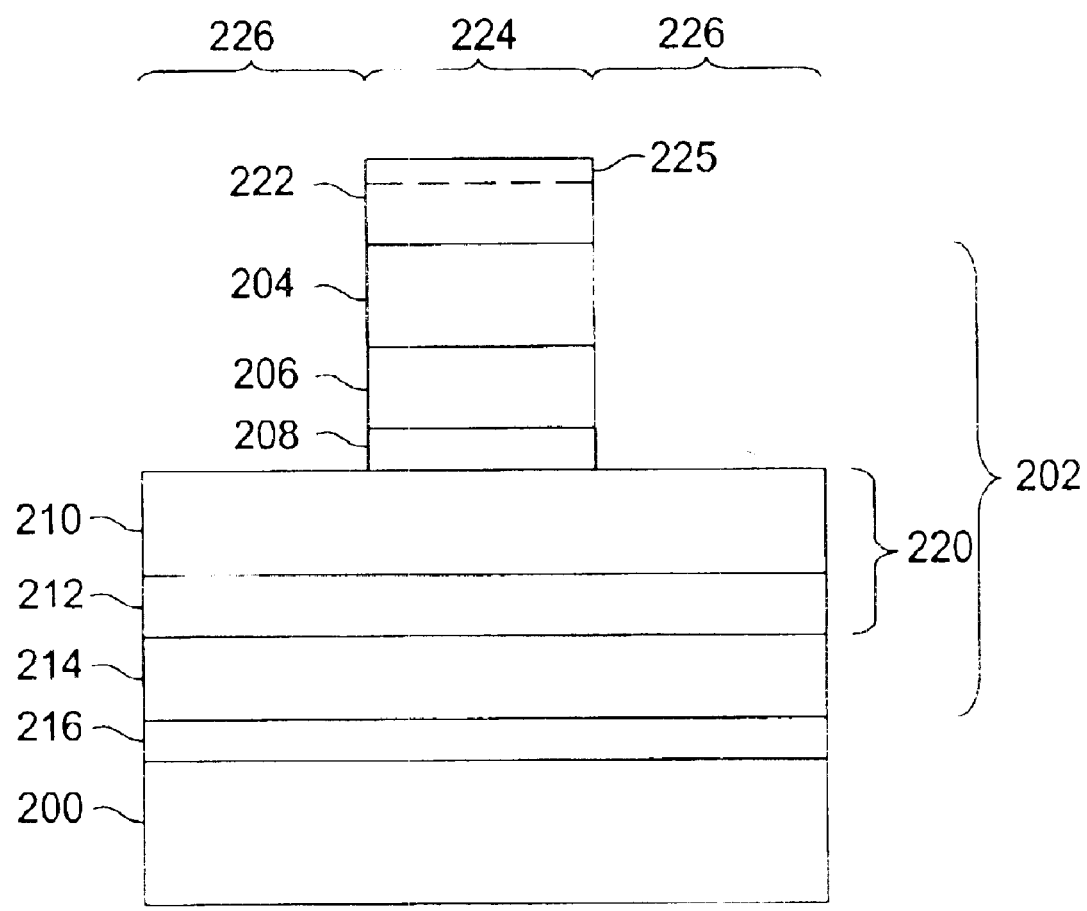

At step 106, a second etch mask 222 is formed on the top electrode layer 204 of the MRAM film stack 202 (FIG. 2C). In the depicted embodiment, the second etch mask 222 protects regions 224 of the MRAM film stack 202 and exposes adjacent regions 226 thereof. The second etch mask 222 is generally a hard mask formed of silicon dioxide ($SiO_2$), silicon nitride ($Si_3N_4$), α-carbon (amorphous carbon), and the like. Alternatively, the second etch mask 222 may be formed of photoresist or of Advanced Patterning Film™ (APF) (available from Applied Materials, Inc. of Santa Clara, Calif.).

In an alternate embodiment (not shown), the first etch mask 201 may be utilized for step 106. For such an embodiment, the first etch mask 201 remains on the MRAM film stack 202 after the top electrode layer 204, magnetic layer 206, and tunnel layer 208 have been etched.

The second etch mask 222 may optionally comprise an anti-reflective layer 225 (shown with dashed lines in FIG. 2C) that controls the reflection of light used to pattern the second etch mask. As feature sizes are reduced, inaccuracies in an etch mask pattern transfer process can arise from optical limitations that are inherent to the lithographic process, such as light reflection. The anti-reflective layer may comprise, for example, silicon nitride (SiN), polyamides, and the like.

Processes of applying the second etch mask 222 are described, for example, in commonly assigned U. S. patent applications Ser. No. 10/245,130, filed Sep. 16, 2002, Ser. No. 10/338,251, filed Jan. 6, 2002, and in Ser. No. 10/218, 244, filed Aug. 12, 2002, which are incorporated herein by reference.

Figure 2D:
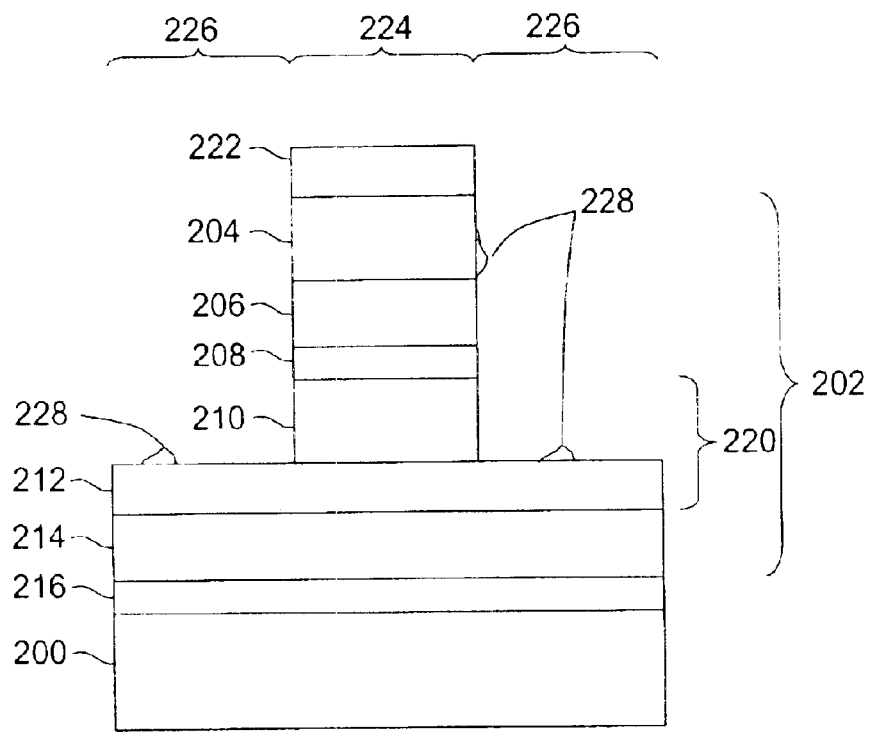
Figure 2E:
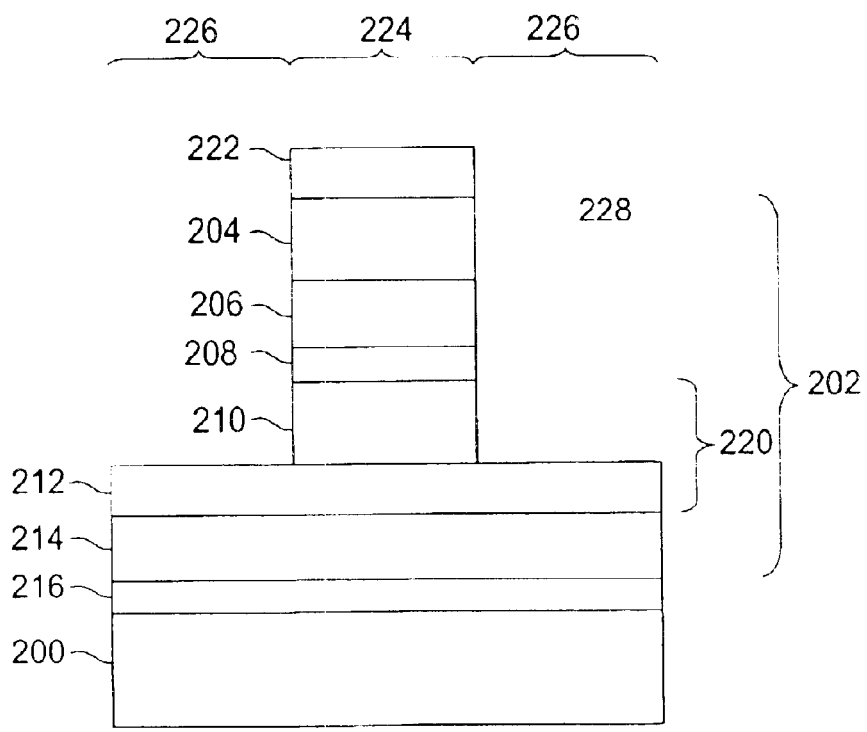

At step 108, the pinned layer 210 of the multi-layer magnetic stack 220 is plasma etched and removed in regions 226 (FIG. 2D). The etch process of step 108 may use a first gas mixture comprising a chlorine-containing gas (i.e., boron trichloride ($BCl_3$), hydrogen chloride (HCl), and the like) and a diluent gas, such as at least one of argon (Ar), neon (Ne), helium (He), and the like. During step 108, the substrate is maintained at a temperature of at least 80 degrees Celsius to decrease formation of non-volatile by-products, such as post-etch residue 228 (e.g., metal-containing residue) on the substrate. In one embodiment, step 108 uses the second etch mask 222 as an etch mask and the pinning layer 212 of the multi-layer magnetic stack 220 as an etch stop layer.

Step 108 may be performed in an etch reactor such as a Decoupled Plasma Source (DPS) II module of the CENTURA® system. The DPS II module (described in detail with reference to FIG. 4 below) uses a 2 MHz inductive source to produce a high-density plasma. To determine the endpoint of the etch process, the etch reactor may also include an endpoint detection system to monitor plasma emissions at a particular wavelength, laser interferometry, control of process time, and the like.

In one illustrative embodiment, the pinned layer 210 comprising a film of ruthenium (Ru) sandwiched between films of cobalt-iron alloy (CoFe) is etched using the DPS II module by providing a chlorine-based gas (i.e., boron trichloride ($BCl_3$)) at a rate of about 5 to 25 sccm, a diluent gas (i.e., argon (Ar)) at a rate of about 20 to 100 sccm (i.e., a $BCl_3$:Ar flow ratio ranging from 1:20 to 1.25:1), applying power to an inductively coupled antenna between 200 and 3000 W, applying a cathode bias power between 0 and 300 W, and maintaining a wafer temperature of about 15 to 250 degrees Celsius at a pressure in the process chamber between 5 and 40 mTorr. One illustrative etch process provides $BCl_3$ at a rate of 20 sccm, Ar at a rate of 80 sccm (i.e., a $BCl_3$:Ar flow ratio of about 1:4), applies 750 W of power to the inductively coupled antenna, 150 W of bias power, and maintains a wafer temperature of 80 degrees Celsius at a chamber pressure of 5 mTorr. Such a process provides etch selectivity for the cobalt-iron alloy (CoFe) and ruthenium (Ru) (layer 210) over the platinum-manganese alloy (PtMn) (layer 212) of at least 1:1, as well as etch selectivity for the cobalt-iron alloy (CoFe) and ruthenium (Ru) over silicon dioxide ($SiO_2$) (second etch mask 222) of about 0.5:1.

At step 110, non-volatile by-products (i.e., post-etch residues 228) are removed from the substrate (FIG. 2E) by replacing the first gas mixture (step 108) with an inert gas, such as at least one of argon (Ar), neon (Ne), helium (He) and the like. Thus, at the end of step 108, a flow of the inert gas is provided to the process chamber in a manner such that a plasma is maintained therein. Thereafter, during step 110, the substrate 200 is exposed to a plasma comprising the inert gas. The plasma comprising the inert gas removes non-volatile by-products from the substrate 200 formed thereon during step 108.

In one embodiment, the inert gas may be provided to the process chamber coincident with gradual evacuation of the first gas mixture in such a manner that the gas pressure in the process chamber is sufficient for maintaining a plasma comprising the first gas mixture and the inert gas. The inert gas mixes with residual gas from the first gas mixture that is present when the inert gas is introduced to the process chamber.

Figure 3:
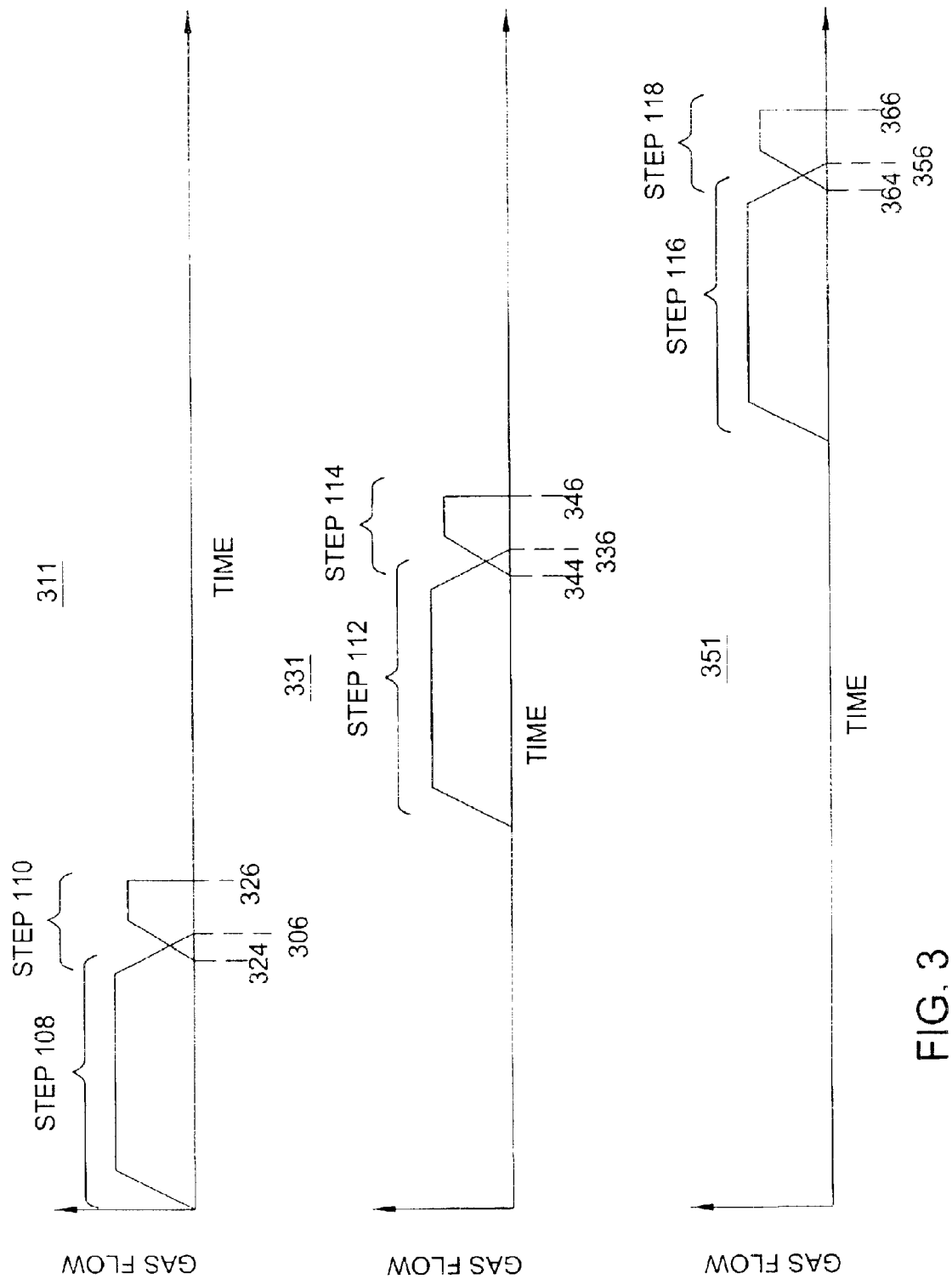
FIG. 3 depicts a series of timing diagrams for plasma etch and plasma treatment steps performed in accordance with one embodiment of the present invention.

FIG. 3 depicts a series of timing diagrams for plasma etch and plasma treatment steps performed in accordance with one embodiment of the present invention wherein gas flow (y-axis) is plotted as a function of time (x-axis).

Illustratively, graph 311 depicts one embodiment for removing post-etch residues by providing a flow of the inert gas (step 110) at a time 324 coincident with the end of step 108, so as to maintain a plasma in the process chamber until step 110 is terminated at time 326. Residual gas from the first gas mixture remains in the process chamber for a time 306 after the end of step 108.

In one illustrative embodiment, step 110 is performed using the DPS II module by providing argon (Ar) at a rate of between 50 to 400 sccm, applying power to the inductively coupled antenna of between 0 and 3000 W, applying a cathode bias power between 0 and 50 W, and maintaining a wafer temperature of about 15 to 250 degrees Celsius at a pressure in the process chamber between 5 and 40 mTorr. One illustrative process provides argon (Ar) at a rate of 200 sccm, applies 750 W of power to the inductively coupled antenna and maintains a wafer temperature of 80 degrees Celsius at a chamber pressure of 10 mTorr. The duration of step 110 is generally between 5 and 30 seconds.

Figure 2F:
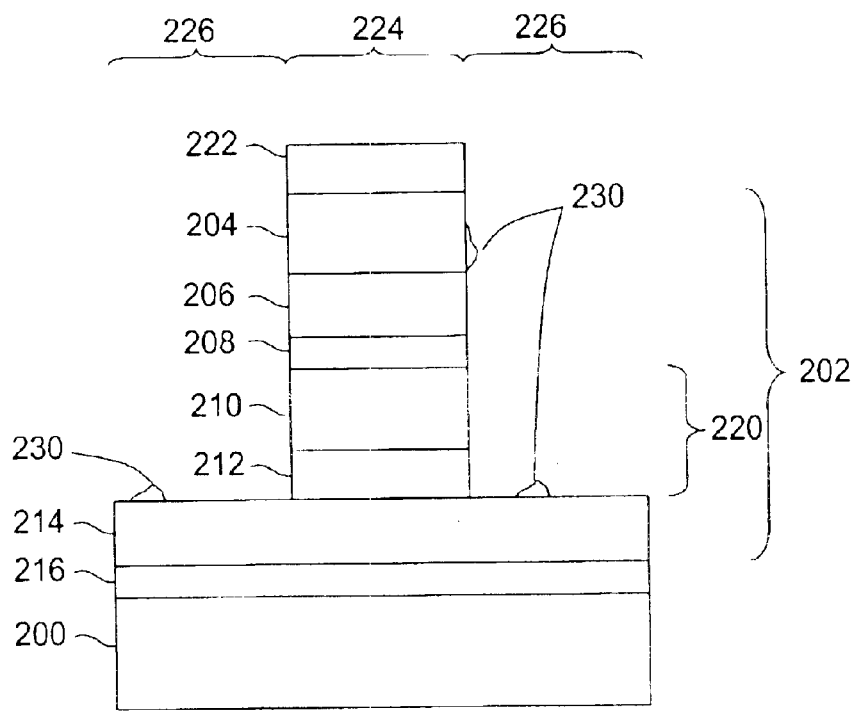
Figure 2G:
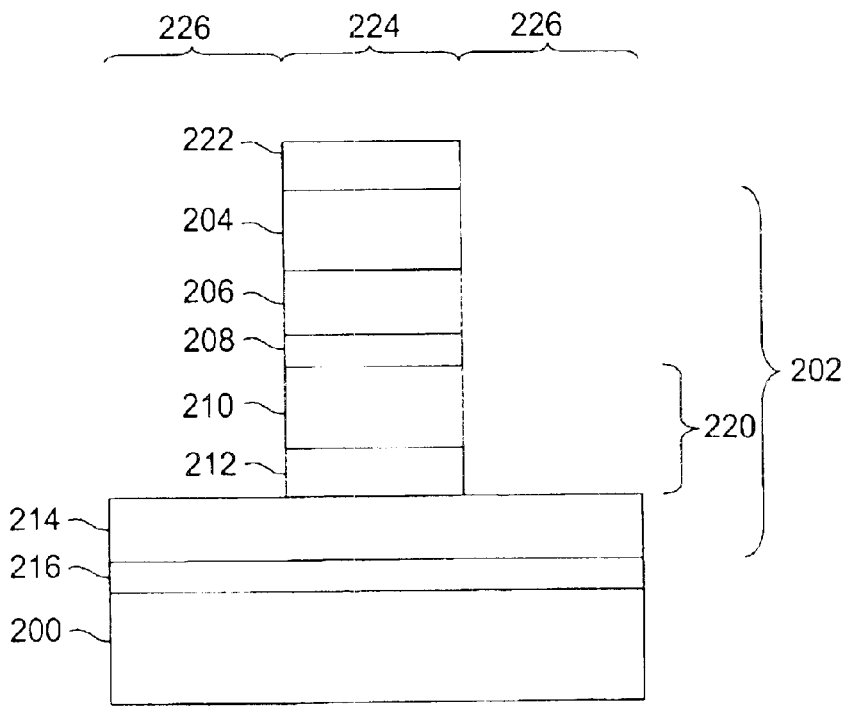

At step 112, the pinning layer 212 of the multi-layer magnetic stack 220 is plasma etched and removed in regions 226 (FIG. 2F). The etch process of step 112 may use a second gas mixture comprising a chlorine-containing gas (i.e., boron trichloride ($BCl_3$), hydrogen chloride (HCl), and the like) and a diluent gas, such as at least one of argon (Ar), neon (Ne), helium (He), and the like. When the pinning layer 212 is etched, the substrate is maintained at a temperature of at least 80 degrees Celsius to decrease formation of non-volatile by-products, such as post-etch residues 230. In one embodiment, step 112 uses the second etch mask 222 as an etch mask and the bottom electrode layer 214 as an etch stop layer.

In one illustrative embodiment, the pinning layer 212, comprising a film of platinum-manganese (PtMn) alloy, is etched using the DPS II module by providing a chlorine-based gas (i.e., boron trichloride ($BCl_3$)) at a rate of about 5 to 25 sccm, a diluent gas (i.e., Argon (Ar)) at a rate of about 20 to 100 sccm (i.e., $BCl_3$:Ar flow ratio ranging from 1:20 to 1.25:1), applying power to an inductively coupled antenna between 200 and 3000 W, applying a cathode bias power between 0 and 300 W, and maintaining a wafer temperature of about 15 to 250 degrees Celsius at a pressure in the process chamber between 5 and 40 mTorr. One illustrative etch process provides $BCl_3$ at a rate of 20 sccm, Ar at a rate of 80 sccm (i.e., a $BCl_3$:Ar flow ratio of about 1:4), applies 750 W of power to the inductively coupled antenna, 150 W bias power, and maintains a wafer temperature of 80 degrees Celsius at a chamber pressure of 5 mTorr. Such an etch process provides etch selectivity for the platinum-manganese alloy (layer 212) over tantalum or tantalum nitride (layer 214) of at least 1:1, as well as etch selectivity for the platinum-manganese alloy (layer 212) over silicon dioxide (mask 222) of about 0.5:1.

At step 114, non-volatile by-products are removed from the substrate (FIG. 2G) by replacing the second gas mixture (step 112) with an inert gas, such as at least one of argon (Ar), neon (Ne), helium (He), and the like. Similar to step 110, the inert gas is provided in a manner such that a plasma is maintained in the process chamber (e.g., gradual evacuation of the second etchant gas mixture and replacement thereof with the inert gas. The plasma comprising the inert gas removes non-volatile by-products from the substrate 200 formed thereon during step 112.

Graph 331 (FIG. 3) depicts one embodiment for removing post-etch residues by providing a flow of the inert gas (step 114) at a time 344 coincident with the end of step 112, so as to maintain a stable plasma in the process chamber until step 114 is terminated at time 346. Residual gas from the second gas mixture remains in the process chamber for a time 336 after the end of step 112.

Generally, step 114 is performed as described above with reference to step 110. One illustrative process provides argon (Ar) at a rate of 100 sccm, applies 750 W of power to the inductively coupled antenna, applies 0 W of bias power and maintains a wafer temperature of 80 degrees Celsius at a chamber pressure of 5 mTorr. The duration of step 114 is generally between 5 and 30 seconds.

Figure 2H:
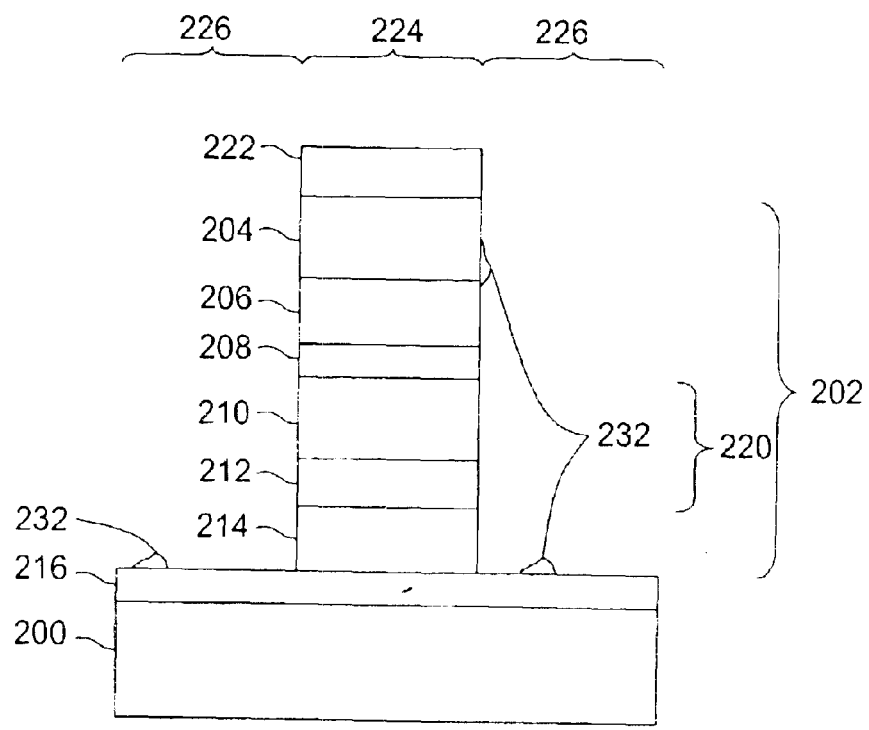
Figure 2I:
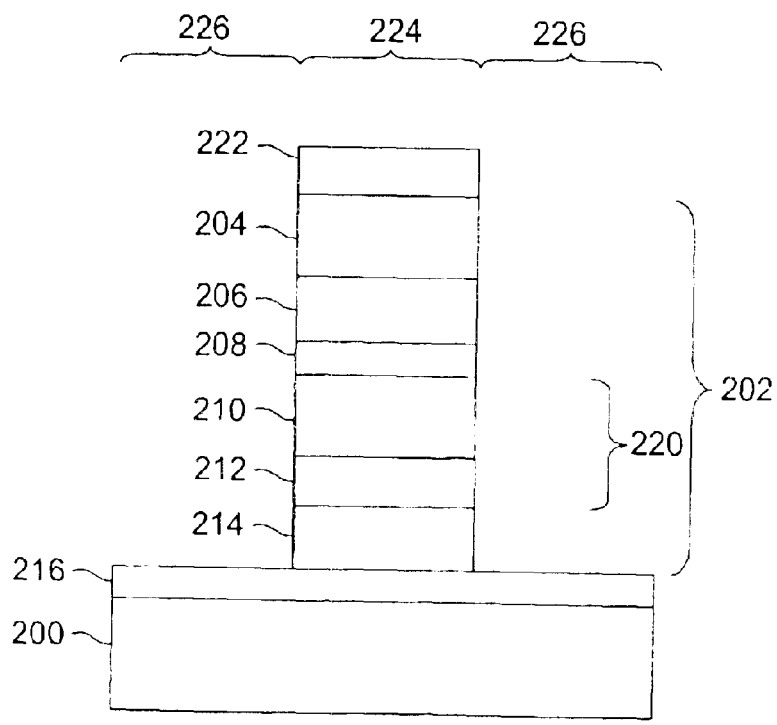

At step 116, the bottom electrode layer 214 is plasma etched and removed in the regions 226 (FIG. 2H). In one embodiment, the bottom electrode layer 214 may be etched using a third gas mixture comprising a chlorine-containing gas (e.g., chlorine ($Cl_2$)) and a diluent gas, such as at least one of argon (Ar), neon (Ne), helium (He), and the like. During step 116, the substrate is maintained at a temperature of at least 80 degrees Celsius to decrease formation of post-etch residue 232. In one embodiment, step 116 uses the second etch mask 222 as an etch mask and the barrier layer 216 as an etch stop layer.

In one illustrative embodiment, the bottom electrode layer 214 comprising tantalum (Ta) or tantalum nitride (TaN) is etched using the DPS II module by providing chlorine ($Cl_2$) at a rate of 10 to 100 sccm, argon (Ar) at a rate of 10 to 100 sccm (i.e., a $Cl_2$:Ar flow ratio ranging from 1:10 to 10:1), applying power to an inductively coupled antenna of between 200 and 3000 W, applying a cathode bias power between 0 and 300 W, and maintaining a wafer temperature of about 15 to 80 degrees Celsius at a pressure in the process chamber between 5 and 40 mTorr. One illustrative etch process provides chlorine ($Cl_2$) at a rate of 45 sccm, Ar at a rate of 45 sccm (i.e., a $Cl_2$:Ar flow ratio of about 1:1), applies 700 W of power to the antenna, applies 25 W of bias power, and maintains a wafer temperature of 80 degrees Celsius at a chamber pressure of 10 mTorr. Such a process provides etch selectivity for the tantalum or tantalum nitride (layer 214) over silicon dioxide (layer 216, mask 222) of at least 1:1.

At step 118, non-volatile by-products are removed from the substrate (FIG. 2I) by replacing the third gas mixture (step 116) with an inert gas, such as at least one of argon (Ar), neon (Ne), helium (He), and the like. Similar to steps 110 and 114, the inert gas is provided in a manner such that a plasma is maintained in the process chamber (e.g., gradual evacuation of the third gas mixture and replacement thereof with the inert gas. The plasma comprising the inert gas removes non-volatile by-products from the substrate 200 formed thereon during step 116.

Graph 351 depicts one embodiment for removing post-etch residues by providing a flow of the inert gas (step 118) at a time 364 coincident with the end of step 116, so as to maintain a stable plasma in the process chamber until step 118 is terminated at time 366. Residual gas from the third gas mixture remains in the process chamber for a time 356 after the end of step 118.

Generally, step 118 is performed as described above with reference to steps 110 and 114, however, in step 118, the substrate 200 may additionally be biased by applying at least 25 W of bias power. The bias power is generally a continuous radio-frequency power having a frequency in a range from about 50 kHz to 13.6 MHz. During step 118, the barrier layer 216 is exposed. The barrier layer 216 comprises a dielectric material (i.e., silicon dioxide ($SiO_2$), silicon nitride ($Si_3N_4$)). The bias power is used to remove any metallic residues from the dielectric material.

One illustrative etch process provides argon (Ar) at a rate of 100 sccm, applies 750 W of power to the inductively coupled antenna, 25 W of bias power to the substrate and maintains a wafer temperature of 80 degrees Celsius at a chamber pressure of 5 mTorr. The duration of step 118 is generally between 5 and 30 seconds.

At step 120, the sequence 100 ends.

Figure 4:
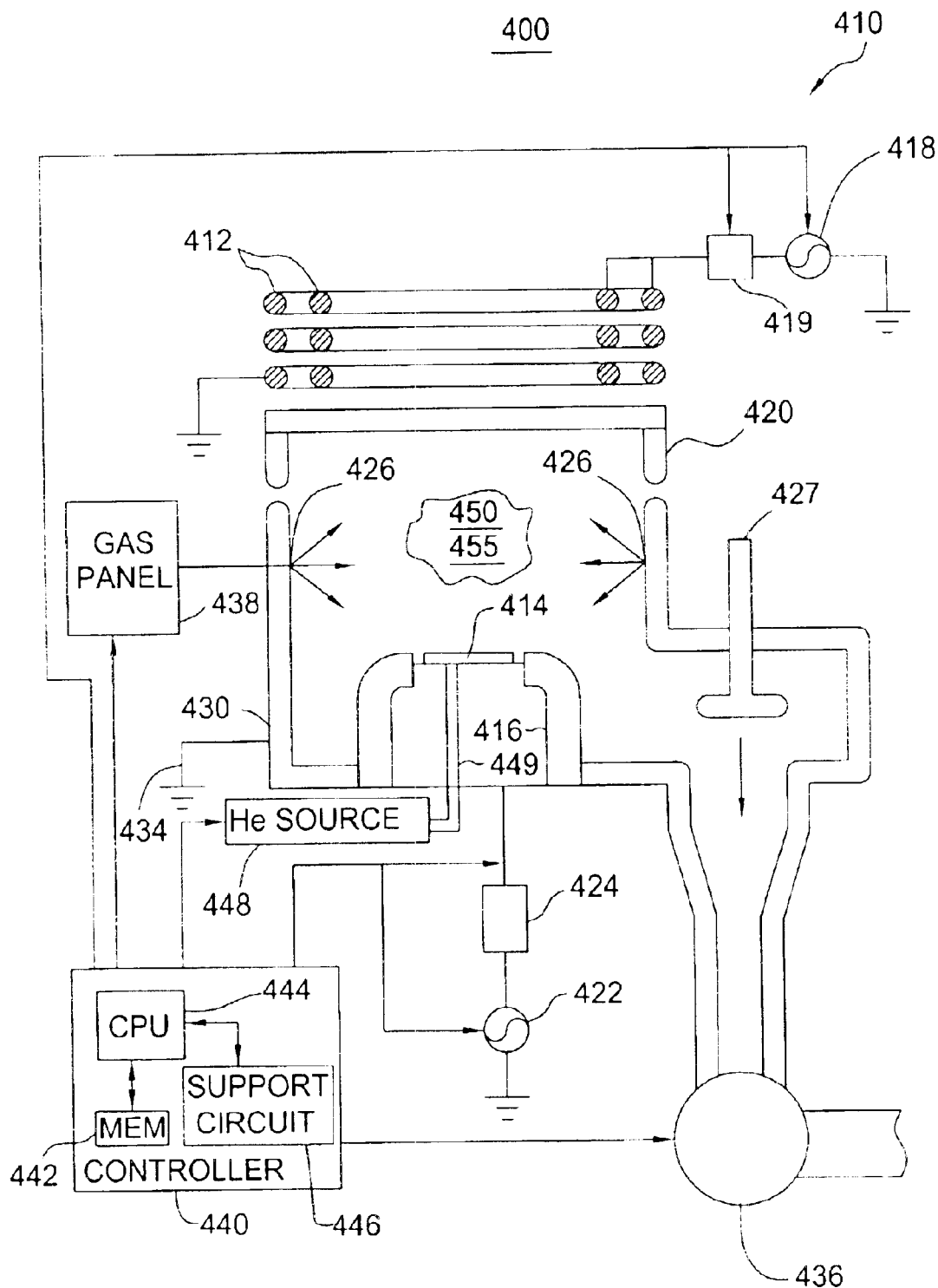
FIG. 4 depicts a schematic diagram of an exemplary plasma processing apparatus of the kind used in performing portions of the inventive method.

One illustrative embodiment of an etch reactor that can be used to perform the steps of the present invention is depicted in FIG. 4. More specifically, FIG. 4 depicts a schematic diagram of the exemplary Decoupled Plasma Source (DPS) II etch reactor 400 that may be used to practice portions of the invention. The DPS II reactor is available from Applied Materials, Inc. of Santa Clara, Calif.

The reactor 400 comprises a process chamber 410 having a wafer support pedestal 416 within a conductive body (wall) 430, and a controller 440.

The chamber 410 is supplied with a substantially flat dielectric ceiling 420. Other modifications of the chamber 410 may have other types of ceilings, e.g., a dome-shaped ceiling. Above the ceiling 420 is disposed an antenna comprising at least one inductive coil element 412 (two co-axial elements 412 are shown). The inductive coil element 412 is coupled, through a first matching network 419, to a plasma power source 418. The plasma source 418 typically is capable of producing up to 4000 W at a tunable frequency in a range from 50 kHz to 13.56 MHz.

The support pedestal (cathode) 416 is coupled, through a second matching network 424, to a biasing power source 422. The biasing source 422 generally is a source of up to 500 W at a frequency of approximately 13.56 MHz that is capable of producing either continuous or pulsed power. In other embodiments, the source 422 may be a DC or pulsed DC source.

The controller 440 comprises a central processing unit (CPU) 444, a memory 442, and support circuits 446 for the CPU 444 and facilitates control of the components of the DPS II etch process chamber 410 and, as such, of the etch process, as discussed below in further detail.

In operation, a semiconductor wafer 414 is placed on the pedestal 416 and process gases are supplied from a gas panel 438 through entry ports 426 to form a gaseous mixture 450. The gaseous mixture 450 is ignited into a plasma 455 in the chamber 410 by applying power from the plasma and bias sources 418 and 422 to the inductive coil element 412 and the cathode 416, respectively. The pressure within the interior of the chamber 410 is controlled using a throttle valve 427 and a vacuum pump 436. Typically, the chamber wall 430 is coupled to an electrical ground 434. The temperature of the wall 430 is controlled using liquid-containing conduits (not shown) that run through the wall 430.

The temperature of the wafer 414 is controlled by stabilizing a temperature of the support pedestal 416. In one embodiment, helium gas from a gas source 448 is provided via a gas conduit 449 to channels (not shown) formed in the pedestal surface under the wafer 414. The helium gas is used to facilitate heat transfer between the pedestal 416 and the wafer 414. During processing, the pedestal 416 may be heated by a resistive heater (not shown) within the pedestal to a steady state temperature and then the helium gas facilitates uniform heating of the wafer 414. Using such thermal control, the wafer 414 is maintained at a temperature of between 0 and 500 degrees Celsius.

Those skilled in the art will understand that other forms of etch chambers may be used to practice the invention, including chambers with remote plasma sources, electron cyclotron resonance (ECR) plasma chambers, and the like.

To facilitate control of the process chamber 410 as described above, the controller 440 may be one of any form of general-purpose computer processor that can be used in an industrial setting for controlling various chambers and sub-processors. The memory, or computer-readable medium, 442 of the CPU 444 may be one or more of readily available memory such as random access memory (RAM), read only memory (ROM), floppy disk, hard disk, or any other form of digital storage, local or remote. The support circuits 446 are coupled to the CPU 444 for supporting the processor in a conventional manner. These circuits include cache, power supplies, clock circuits, input/output circuitry and subsystems, and the like. The inventive method is generally stored in the memory 442 as a software routine. The software routine may also be stored and/or executed by a second CPU (not shown) that is remotely located from the hardware being controlled by the CPU 444.

The invention may be practiced using other semiconductor wafer processing systems wherein the processing parameters may be adjusted to achieve acceptable characteristics by those skilled in the art by utilizing the teachings disclosed herein without departing from the spirit of the invention.

Although the forgoing discussion referred to fabrication of the MRAM device, fabrication of the other devices and structures that are used in integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method of plasma etching metal layers, comprising:
   (a) providing a substrate having a patterned mask formed on a plurality of metal layers thereon,
   (b) generating a first plasma comprising a first gas mixture;
   (c) etching a first metal layer of the plurality of metal layers using the first plasma, wherein metallic residue is formed on the substrate; and (d) replacing the first plasma with a second plasma comprising an inert gas;

wherein exposure of the substrate to the second plasma removes the metallic residue formed on the substrate.

2. The method of claim 1 wherein the second plasma replaces the first plasma coincident with the end of step (c).

3. The method of claim 1 wherein the inert gas comprises at least one gas selected from the group consisting of argon (Ar), neon (Ne) and helium (He).

4. The method of claim 1 wherein the plurality of metal layers comprise at least one of a magnetic layer and an anti-ferromagnetic layer.

5. The method of claim 1 wherein the plurality of metal layers comprise at least one of cobalt-iron alloy (CoFe), ruthenium (Ru), nickel-iron alloy (NiFe), nickel-iron-chromium alloy (NiFeCr), platinum-manganese alloy (PtMn), iridium-manganese alloy (IrMn), tantalum (Ta) and tantalum nitride (TaN).

6. The method of claim 1 wherein step (d) is performed at a chamber pressure within a range of about 5 to 40 mTorr.

7. The method of claim 1 wherein step (d) comprises exposing the substrate to the second plasma for between about 5 and 30 seconds.

8. The method of claim 1 wherein step (d) comprises:

providing argon (Ar) at a flow of between 50 to 400 sccm;

maintaining the substrate at a temperature of about 15 to 250 degrees Celsius at a process chamber pressure between 5 and 40 mTorr;

applying up to about 3000 W of power to an inductively coupled antenna to form an argon (Ar) plasma; and exposing the substrate to the argon (Ar) plasma for about 5 to 30 seconds.

9. The method of claim 1 wherein steps (c)–(d) are repeated for at least a second metal layer of the plurality of metal layers.

10. A computer-readable medium containing software that when executed by a computer causes a semiconductor wafer processing system to etch a material layer on a substrate using a method, comprising:

(a) providing a substrate having a patterned mask formed on a plurality of metal layers thereon, (b) generating a first plasma comprising a first gas mixture;

(c) etching a first metal layer of the plurality of metal layers using the first plasma, wherein metallic residue is formed on the substrate; and (d) replacing the first plasma with a second plasma comprising an inert gas, wherein exposure of the substrate to the second plasma removes the metallic residue formed on the substrate.

11. The computer readable medium of claim 10 wherein the second plasma replaces the first plasma coincident with the end of step (c).

12. The computer-readable medium of claim 10 wherein the inert gas comprises at least one gas selected from the group consisting of argon (Ar), neon (Ne) and helium (He).

13. The computer-readable medium of claim 10 wherein the plurality of metal layers comprise at least one of a magnetic layer and an anti-ferromagnetic layer.

14. The computer-readable medium of claim 10 wherein step (d) is performed at a chamber pressure within a range of about 5 to 40 mTorr.

15. The computer-readable medium of claim 10 wherein step (d) is performed for between about 5 and 30 seconds.

* * * * *

UNITED STATES PATENT AND TRADEMARK OFFICE
CERTIFICATE OF CORRECTION

PATENT NO. : 6,841,484 B2 Page 1 of 1
APPLICATION NO. : 10/418449
DATED : January 11, 2005
INVENTOR(S) : Ying et al.

It is certified that error appears in the above-identified patent and that said Letters Patent is hereby corrected as shown below:

In column 3, line 35, delete "water" and insert -- wafer --, therefor.

In column 8, line 15, delete "water" and insert -- wafer --, therefor.

Signed and Sealed this

Fifteenth Day of January, 2008

JON W. DUDAS
*Director of the United States Patent and Trademark Office*